(12) United States Patent
Tanguay

(10) Patent No.: US 6,508,883 B1
(45) Date of Patent: Jan. 21, 2003

(54) THROUGHPUT ENHANCEMENT FOR SINGLE WAFER REACTOR

(75) Inventor: Michael J. Tanguay, Peoria, AZ (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/563,784

(22) Filed: Apr. 29, 2000

(51) Int. Cl.$^7$ .............................................. C23C 16/00
(52) U.S. Cl. ....................... 118/719; 118/728; 118/500; 156/345.31; 156/345.32; 156/345.51
(58) Field of Search ................................. 118/500, 728, 118/719, 725, 729; 156/345.51, 345.31, 345.32

(56) References Cited

U.S. PATENT DOCUMENTS

| | | | |
|---|---|---|---|
| 4,099,041 A | * 7/1978 | Berkman et al. | 219/634 |
| 4,566,726 A | * 1/1986 | Correnti et al. | 294/64.3 |
| 4,775,281 A | 10/1988 | Prentakis | |
| 4,801,241 A | * 1/1989 | Zajac et al. | 414/786 |
| 4,951,601 A | * 8/1990 | Maydan et al. | 118/719 |
| 5,442,416 A | * 8/1995 | Tateyama et al. | 396/612 |
| 5,626,677 A | * 5/1997 | Shirahata | 118/719 |
| 5,820,686 A | * 10/1998 | Moore | 118/730 |
| 5,855,681 A | 1/1999 | Mayden et al. | |
| 5,879,459 A | * 3/1999 | Gadgil et al. | 118/715 |
| 6,053,980 A | * 4/2000 | Suda et al. | 118/719 |

OTHER PUBLICATIONS

Webster's II New Riverside University Dictionary, The Riverside Publishing Company, p. 291, 1984.*

* cited by examiner

Primary Examiner—Jeffrie R. Lund
(74) Attorney, Agent, or Firm—Margaret Chappuis; Steven J. Hultquist; William Ryann

(57) ABSTRACT

A semiconductor substrate processing system, including a single wafer reactor and a multi-wafer holder positionable in the reactor. The system also optionally includes an automated substrate transport assembly including a multi-wand array for transporting a corresponding plurality of wafers into and out of the reactor, and a multi-wafer cassette for simultaneously supplying multiple wafers to the multi-wand array. The multi-wafer modifications permit ready upgradeability to an existing single wafer reactor and markedly enhance the throughput capacity of the reactor while retaining the film uniformity and deposition process control advantages of the single wafer reactor system.

30 Claims, 3 Drawing Sheets

THROUGHPUT ENHANCEMENT FOR SINGLE WAFER REACTOR

BACKGROUND OF THE INVENTION

1. Field of the Invention

The present invention generally relates to semiconductor manufacturing process systems, and particularly to an enhanced throughput method and apparatus for processing semiconductor wafers in a single wafer reactor.

2. Description of the Art

In the manufacture of semiconductor materials and device structures by deposition of thin film materials, a variety of deposition systems are in conventional use. These deposition systems include a reaction chamber in which the wafer substrate is heated to a high temperature in the presence of a vapor phase source material to deposit the desired thin film on the wafer surface.

Silicon epitaxial films are typically deposited in two general types of reactors. The older type is a batch reactor, which holds many wafers at a time. Batch reactors have progressively grown in size, driven by the desire for increased throughput. A state of the art batch reactor can hold 34 100 mm diameter wafers and 18 150 mm diameter wafers. A typical process time for a batch reactor is several hours; thus, throughputs of tens of wafers per hour can be achieved. Nonetheless, the large area required to hold such numbers of multiple wafers (the wafer carrier or the susceptor in such large system is on the order of 30 inches in diameter) results in less than desirable uniformity across all wafers. The susceptors in such large systems typically have two or more concentric rows of wafers, and the characteristics in each row can be significantly different. In order to achieve improved uniformity, especially on large diameter wafers (150 mm and larger), single wafer reactors were developed.

Single wafer reactors have a process chamber that is only slightly larger than the wafer diameter. This results in improved control of the processing conditions and thus yields improved uniformity of the product thin films. The characteristics of primary importance in the product thin film are uniformity of film thickness and uniformity of film resistivity of the silicon epitaxial thin film. Typical process time for a single wafer reactor is on the order of 10-20 minutes with relatively thin (<30 micrometers thickness) epitaxial films, resulting in a throughput of 3-6 wafers per hour.

For large area substrates, single wafer reaction chambers provide very high uniformity, reproducibility, and yield. Multiple-wafer reaction chambers are typically not able to achieve the same levels of uniformity and reproducibility, and the performance of multiple-wafer reaction chambers degrades significantly as the substrate diameter increases. In single wafer deposition systems, the throughput, expressed as the number of substrates processed per unit time, does not change dramatically with the substrate area. Thus, a 100 mm diameter substrate requires almost the same amount of time for processing as a 200 mm diameter substrate. The decreased processing time for the smaller substrate in a single substrate reactor is on the order of 5-15%. In contrast, multi-substrate reactors are able to achieve large increases in throughput with decreasing substrate area. By way of illustration, a typical barrel reactor (see, for example, U.S. Patent No. 4,099,041 issued Jul. 4, 1978 to Berkman et al. for "Susceptor for Heating Semiconductor Substrates") may hold fifteen 150 mm diameter substrates, eighteen 125 mm substrates, and twenty-eight 100 mm substrates. There is thus a dramatic improvement in throughput for smaller diameter substrates.

As a result of this greater throughput efficiency, single wafer deposition tools are not cost-competitive with multi-substrate reactors for smaller diameter substrates. This disadvantage, however, must be balanced against the greater uniformity and reproducibility achievable in processing smaller diameter substrates in single wafer deposition chambers. Further, there is a large existing base of installed single wafer deposition systems.

U.S. Patent No. 5,855,681 issued Jan. 5, 1999 to Mayden, et al. for "Ultra High Throughput Wafer Vacuum Processing System" discloses one approach to the problem of achieving high throughput of wafers. The disclosure of such patent is incorporated herein by reference in its entirety. Mayden provides a complex apparatus utilizing a plurality of dual wafer processing chambers arrayed around a common wafer handling system (robot), together with a loadlock chamber for introducing and extracting wafers from the system. The Mayden system is an integrated, stand-alone wafer processing system comprising multiple complex sub-functions, and thus entails an intricate and expensive apparatus requiring correspondingly complex and expensive support systems.

There is accordingly a need in the art to provide a thin film deposition system for smaller diameter substrates that improves operating efficiency by processing a significantly greater number of wafers per unit time, while retaining the significant advantages of uniformity and reproducibility that are characteristic of a single wafer deposition chamber, in a relatively simple and economic apparatus configuration.

It is one object of the invention to provide an improved reactor system for epitaxial thin film formation.

It is another object of the present invention to provide a means and method for improving the throughput and operational efficiency of a single wafer reactor.

It is a further object of the present invention to provide an increased throughput thin film deposition processing system for smaller diameter wafers, utilizing existing single wafer reaction chambers and their associated (existing) wafer handling and processing systems.

It is a still further object of the present invention to provide an increased throughput thin film deposition processing system for smaller diameter wafers, utilizing existing single wafer reaction chambers and their associated (existing) wafer handling and processing systems, in a manner that minimizes new expenditure requirements and maximizes utilization of existing investment in semiconductor processing equipment.

Other objects and advantages of the present invention will be more fully apparent from the ensuing disclosure and appended claims.

SUMMARY OF THE INVENTION

The present invention relates to an enhanced throughput method and apparatus for processing plural semiconductor wafers in a single wafer reactor.

The method and apparatus of the invention are therefore amenable to implementation as a retrofit modification of an existing single wafer reactor, to enhance the throughput capacity thereof.

In one aspect, the invention relates to a semiconductor substrate processing system, comprising:

a reactor comprising a single substrate deposition chamber; and a wafer holder positionable in the deposition chamber, having a plurality of recesses formed therein, with each of such recesses being arranged and configured to hold a correspondingly sized substrate therein.

In another aspect, the invention relates to a method of increasing the throughput of a semiconductor processing system including a reactor comprising a single substrate deposition chamber, by positioning in the deposition chamber a substrate holder having a plurality of recesses formed therein, with each of said recesses being arranged and configured to hold a correspondingly sized substrate therein.

Other aspects, features and embodiments of the invention will be more fully apparent from the ensuing disclosure and claims.

DETAILED DESCRIPTION OF THE INVENTION, AND PREFERRED EMBODIMENTS THEREOF

The present invention provides an apparatus and method for processing two or more wafers at a time in what was originally a single wafer processing system. The invention in one embodiment utilizes a wafer holder (e.g., susceptor) for holding multiple substrates, a substrate cassette for storage and bulk transport of multiple arrays of substrates, and an automated transfer mechanism to transfer substrates from the substrate cassette to the reactor and subsequently (after thin film deposition has been completed in the reactor) from the reactor to the same or a different substrate cassette.

Such automated transfer mechanism preferably is under computer control and functions without human intervention.

The substrate cassette may be configured in any suitable manner to provide a source of substrates to the reactor, being preferably configured as hereinafter more fully described, to accommodate multiple arrays of the substrates, as a source for wafers that are picked up, transported to the deposition chamber of the reactor, coated in the deposition chamber, then extracted from the chamber of the reactor, and transported to the same cassette, or to a different cassette or other repository for the coated substrate articles.

Figure 1A:
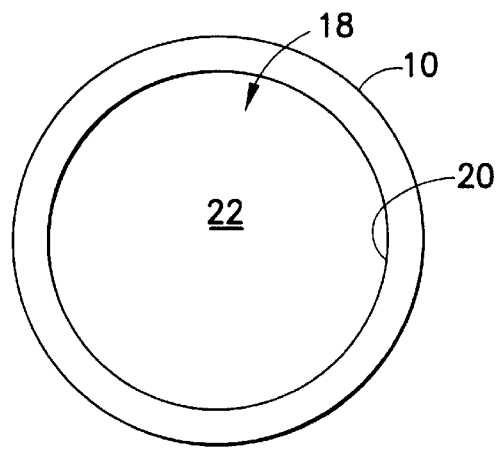
FIG. 1A (PRIOR ART) is a schematic top plan view of a substrate holder of the prior art.

FIG. 1A depicts in top plan view a prior art substrate holder 10 deployed in a typical single substrate reactor. The prior art substrate holder 10 is a round plate-like element formed of a suitable material such as graphite having appropriate heat-resistant character. The holder 10 as illustrated has a recess 18 formed therein, bounded by the recess side wall 20 and the floor 22 of the recess. The recess is correspondingly sized to retain therein a large substrate, e.g., a wafer of 200 mm diameter.

Figure 1B:
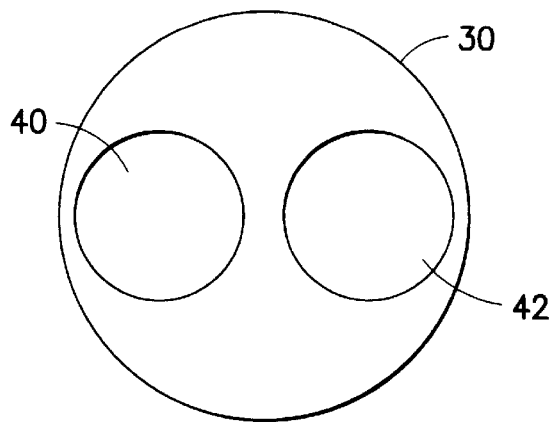
FIG. 1B is a schematic top plan view of a substrate holder according to one embodiment of the present invention.

FIG. 1B is a top plan schematic view of a substrate holder 30 according to one embodiment of the present invention.

The substrate holder 30 is of a round plate-like form, having an outer dimension (outer diameter) that is compatible with the single wafer reactor and corresponds to the outer dimension of the prior art holder for such reactor, as shown in FIG. 1A.

The wafer holder 30 as shown in FIG. 1B recesses 40 and 42 formed therein, with each of the recesses being sized to accept smaller substrates than the corresponding single wafer holder shown in FIG. 1A. For example, the multi-recess wafer holder may have recesses for holding 100 mm diameter wafers therein.

Figure 1C:
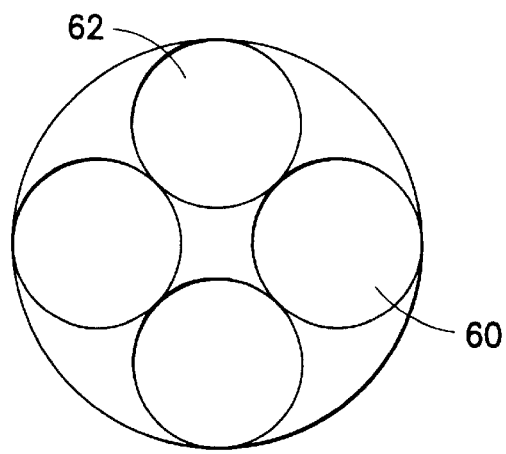
FIG. 1C is a schematic top plan view of a substrate holder according to another embodiment of the present invention.

FIG. 1C is a schematic top plan view of a substrate holder 60 according to another embodiment of the present invention. The substrate holder 60 as illustrated has four recesses 62 therein, each being of a suitable diameter, e.g., 100 mm, to hold a correspondingly sized wafer therein. It will of course be recognized that the recess is typically of slightly larger dimensional character than the wafer to be held therein, so as to provide an appropriate fit, consistent with ready insertability of wafers into and extraction of wafers from the recess, without binding.

In one embodiment, the present invention provides a new substrate cassette and transfer mechanism enabling automatic transfer of a plurality of substrates into and out of the deposition chamber simultaneously.

Figure 2A:
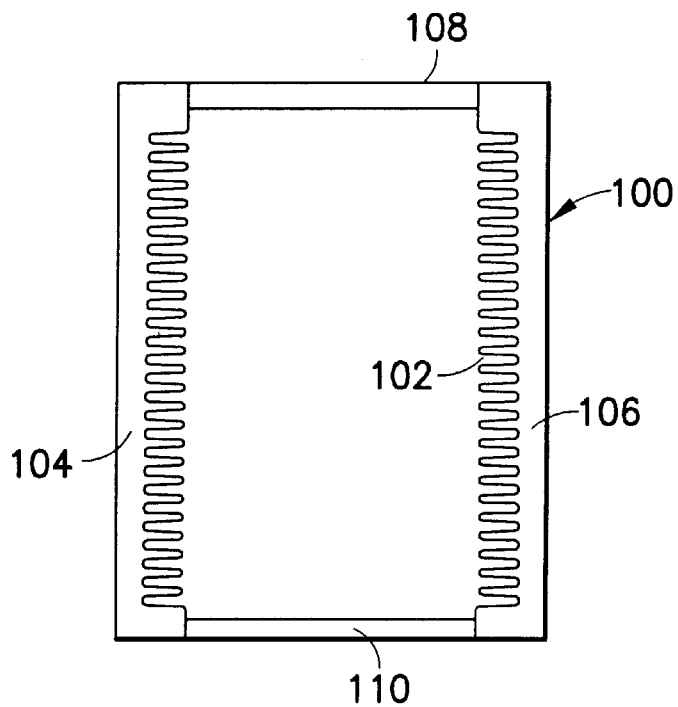
FIG. 2A (PRIOR ART) is a schematic top plan view of a substrate cassette of the prior art.

FIG. 2A depicts a prior art cassette 100 suitable for use with a single chamber reactor.

Cassette 100 is configured to hold a plurality of substrates, typically 25, in slots 102 of the respective oppposedly facing side walls 104 and 106. The side walls 104 and 106 at their respective ends are joined to end walls 108 and 110 to form an open-bottomed box-like container in which the substrates are stored and transported.

Figure 2B:
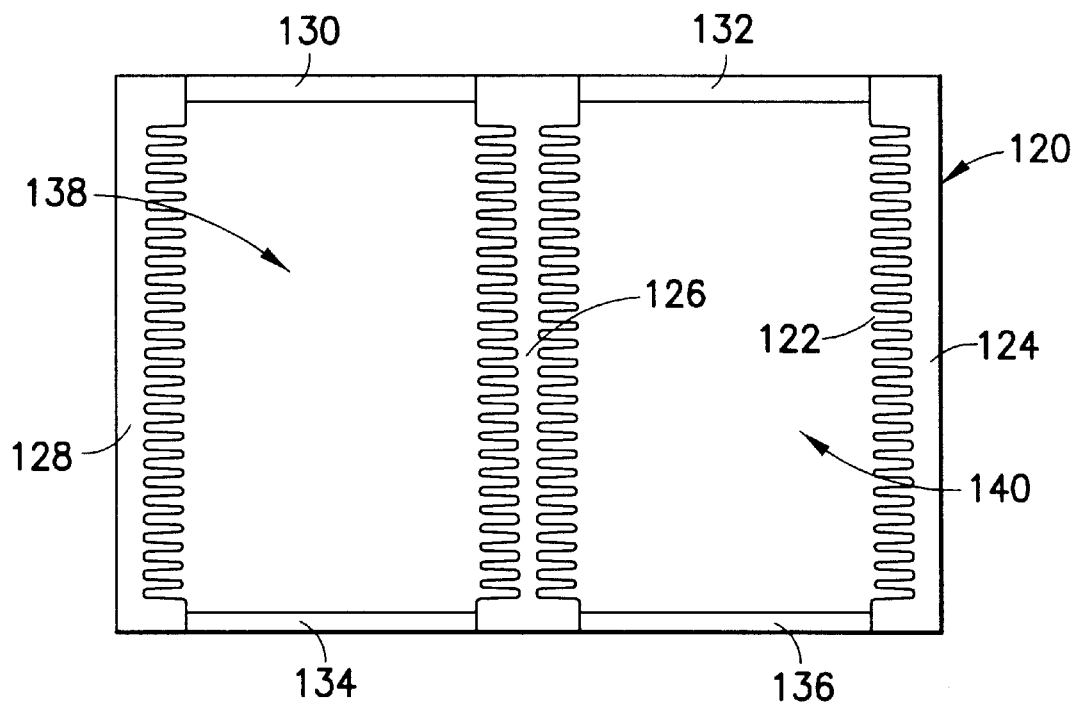
FIG. 2B is a schematic top plan view of a substrate cassette according to one embodiment of the present invention.

FIG. 2B is a schematic top plan view of a substrate cassette 120 according to one embodiment of the present invention. The cassette 120 features slots 122 in side walls 124 and 128 and intermediate wall 126, all of such walls being parallel to each other, and such walls are joined as shown with end walls 130, 132, 134 and 136.

The cassette thereby forms a two-compartment structure, including a first compartment 138 and a second compartment 140, to contain the substrates in slots 122. In this manner, a first array of substrates is retained in the left-hand portion of the cassette (compartment 138, having reference to the top plan view shown in FIG. 2B), and a second array of substrates is retained in the right-hand portion of the cassette (compartment 140) (substrates not shown in FIG. 2B for reasons of clarity).

Figure 3:
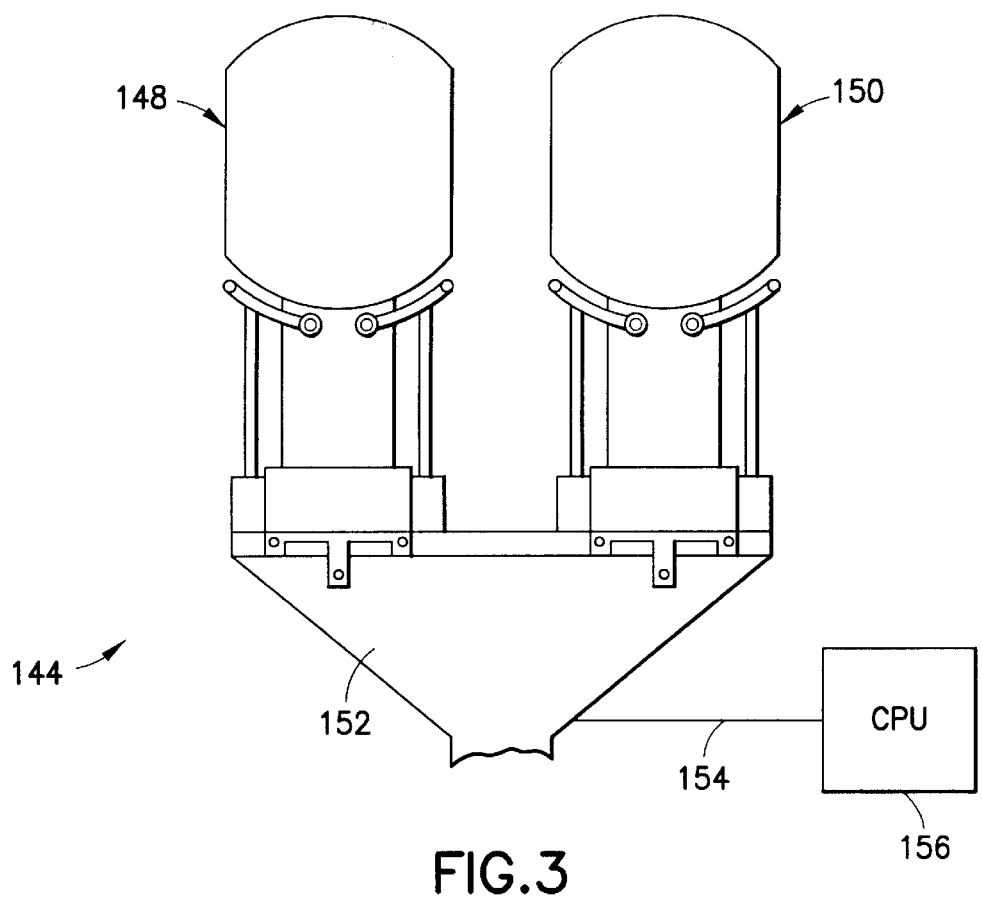
FIG. 3 is a schematic top plan view of a transport assembly unit according to one embodiment of the present invention.

FIG. 3 is a schematic top plan view of a transport assembly unit 144 according to one embodiment of the present invention. The transport assembly unit 144 in the embodiment shown comprises two wand subassemblies 148 and 150 deployed on robotic arm 152 and automated by means of processor (CPU) 156 joined by signal transmission line 154 to the robotic arm.

The processor 156 may be programmably arranged to effect translation of the transport assembly unit and gripping/release actions of the wand subassemblies 148 and 150, according to a cycle time program or other predetermined and actuated sequence of operational steps. The processor may be of any suitable type, as for example a microprocessor or microcontroller unit, or a computer terminal.

In operation, the substrate cassette is loaded into a load-lock station and the transfer mechanism (robot) is programmably arranged to pick substrates out of the cassette and transfer them into the deposition chamber, depositing the substrates into the recesses of the wafer holder. Following thin film deposition within the chamber, the substrates are retrieved by the transfer mechanism and transferred back to either the same cassette or a different cassette.

In the dual substrate array embodiment shown in FIG. 2B the center-to-center spacing of corresponding substrates in respective tray sections of the cassette (e.g., between the center of a wafer in a first slot of the left hand tray section, and the center of a wafer in a first slot of the right-hand tray section) is the same as the center-to-center spacing of the recipient recesses for such substrates in the substrate holder, and such center-to-center spacing is also the same as the center-to-center spacing of the wand elements of the automated substrate transport assembly.

The automated substrate transport assembly is usefully employed as a robot mechanism with plural "wand" or wafer holder elements attached. The wafer may be secured to a corresponding wand during wafer transport, e.g., by vacuum, as disclosed in U.S. Patent No. 4,775,281, Apparatus and Method for Loading and Unloading Wafers, issued to Prentakis on Oct. 4, 1988, the disclosure of which is hereby incorporated herein by reference in its entirety. Alternatively, other suitable securing means and/or methods may employed for wafer transport.

When the multi-wafer holder, automated substrate transport assembly including plural wands, and multi-wafer cassette of the present invention are operatively coupled and employed in accordance with the present invention, smaller (e.g., 100 mm) wafers are processed in the single wafer reactor with significantly greater throughput than is possible when processing larger (e.g., 200 mm) wafers in the same reactor. However, the significant advantages of uniformity and reproducibility of deposition inherent in the single wafer reaction chamber are retained.

As will be clear to those of ordinary skill in the art, variations are possible within the broad scope and spirit of the present invention. For example, two wafers could be simultaneously processed within recesses of the multi-substrate holder, with the transport of the wafers into and out of the deposition chamber being effected by a prior art single wand transfer system, viz., by making two trips. In such arrangement, the wafers could be extracted from and/or deposited into either a single wafer holding cassette, or into a dual cassette of the type illustratively shown in FIG. 2B, by appropriately programming the transport mechanism (robot).

Alternatively, the substrate holder can be configured with three or more recesses formed therein, for the simultaneous processing of more than two substrates. The greatest throughput will be achieved by utilizing a multi-wafer cassette similar to the type shown in FIG. 2B and a multi-wand transfer mechanism similar to the type shown in FIG. 3.

Use of a prior art single wand transfer mechanism with either a dual cassette of the type shown in FIG. 2B or a single cassette of the prior art as shown in FIG. 2A, is within the broad spirit and scope of the present invention and could be practiced by one of ordinary skill in the art without undue experimentation. Similarly, either a single or dual wand transfer mechanism and single or dual cassette may be employed for the insertion and extraction of an odd number of substrates being processed simultaneously in the broad practice of the present invention.

As a further variant embodiment, the same system can be expanded to more than two wafers being transported and/or processed simultaneously.

A double-sided wand is employed in one embodiment of the invention, for loading and unloading wafers, with one wafer being invertedly positioned on the wand, e.g., on an upper face thereof, while a second wafer is normally positioned on a wand on the lower face of the wand. The wand is axially rotatable to translate a formerly bottom face of the wand to a top face position, and to concurrently translate a formerly top face of the wand to a bottom face position, so that associated wafers are flipped in position by such axially rotation of the wand.

A multi-parted cassette could be used in another embodiment, to replace a wand altogether. The cassette parts would act like a wand to load and unload wafers, and a fork-like attachment on the arm (which otherwise would have a wand assembly mounted thereon) would pick up the parts of the cassette. The cassette would in essence disassemble itself in one loadlock of the system, and reassemble again in the other loadlock.

In another embodiment, the susceptor itself could be loaded and unloaded in a cyclic manner. Having two or more susceptors rotating through the deposition chamber would reduce chamber etch times, so that as one susceptor is being etched, another could be running process.

The invention contemplates in another embodiment single wafer transport into and out of the deposition chamber, with the growth process being carried out with a susceptor holding a multiplicity of wafers. For example, a susceptor may be constructed to hold two 125 mm diameter wafers on a single susceptor, but the wafers are loaded and unloaded in serial (single) fashion. By way of specific example, a single wafer reactor may be modified with a susceptor that is constructed to hold two 4-inch wafers on what was nominally a single 8-inch susceptor.

In another example, a single wafer reactor system may be modified by provided a susceptor constructed to hold five 4-inch wafers.

In various other embodiments, the system may be selectively arranged to use only a single substrate holder in the loadlock, for ease of loading and unloading wafers.

The susceptor ring may also be varied and modified in the practice of the invention.

The features and advantages of the invention are more fully shown by the following non-limiting example.

Example 1

An increased through-put thin film deposition processing arrangement in accordance with the present invention was implemented on an ASM Epsilon One, Model E2 silicon chemical vapor deposition (CVD) system. Unmodified, this single wafer reactor can process one substrate at a time, with the diameter of the substrate ranging from 100-200 mm.

Following modification of the system in accordance with the present invention, the system was operated to simultaneously process two 100 mm wafers, with fully automated substrate transfer.

This system was modified to comprise the following components:

A dual cassette was designed to hold dual arrays of 100mm wafers side by side, and to fit into the existing loadlock A transfer mechanism was adapted to contain dual wands on the wafer transfer arm.

A wafer holder was provided with two recesses formed therein, shaped and located to hold two 100 mm substrates.

Concomitant modifications were made in the tools and control logic in the existing rotation and wafer transfer sub-system.

Over 200 dual wafer transfers were performed with no operational problems. The ability to deposit thin films onto two substrates simultaneously in the single substrate reactor effectively doubled the throughput, over sequential processing of single wafers. This resulted in a dramatic reduction in manufacturing costs, while retaining the significant advantages of uniformity and reproducibility of the thin film deposition.

The present invention extends to and encompasses other features, modifications, and alternative embodiments, as will readily suggest themselves to those of ordinary skill in the art based on the disclosure and illustrative teachings herein. The claims that follow are therefore to be construed and interpreted as including all such features, modifications and alternative embodiments, within their spirit and scope.

What is claimed is:

1. A semiconductor substrate processing system, comprising:
   a reactor comprising a single substrate deposition chamber;
   a wafer holder positionable in said deposition chamber, said wafer holder being of plate-like form, and having a plurality of recesses formed therein, wherein n is the number of recesses, to coplanarly hold a corresponding number n of wafers, with a center-to-center distance between adjacent wafers determined by center-to-center spacing between recesses holding said adjacent wafers;
   a substrate cassette coplanarly holding a corresponding number n of wafers therein, wherein wafers coplanarly adjacent to one another have a center-to-center spacing therebetween equal to said center-to-center distance between adjacent wafers in said wafer holder; and
   an automated substrate transport assembly comprising a corresponding number n of coplanar wands, wherein wands coplanarly adjacent to one another have a center-to-center spacing therebetween equal to said center-to-center distance between adjacent wafers in said wafer holder,
wherein the wafer holder, substrate cassette and automated substrate transport assembly are constructed and arranged for simultaneous coplanar loading of said n wafers from the substrate cassette into said n recesses in the wafer holder, simultaneous processing of said n wafers in the wafer holder in the single substrate deposition chamber, and simultaneous coplanar transport of said n wafers from the wafer holder.

2. The system of claim 1, wherein the automated substrate transport assembly and the substrate cassette are constructed and arranged so that when the automated substrate transport assembly is translated into a pickup position relative to the substrate cassette, said corresponding number n of coplanar wands engage and extract said corresponding number n of wafers from the substrate cassette, with each wand engaging and extracting a respective wafer from the substrate cassette, and so that when the automated substrate transport assembly is translated into a deposit position relative to the substrate cassette, said corresponding number n of coplanar wands release and deposit said corresponding number n of wafers on the substrate cassette, with each wand releasing and depositing a respective wafer on the substrate cassette.

3. The system of claim 1, wherein said coplanar wands in the automated substrate transport assembly comprise double-sided coplanar wands.

4. The system of claim 1, further comprising a loadlock chamber for containing the substrate cassette.

5. The system of claim 1, wherein n is 2.

6. The system of claim 1, wherein n is 4.

7. The system of claim 1, wherein the wafer holder has a diameter in the range of from about 200 mm to about 350 mm.

8. The system of claim 1, wherein the wafer holder has a diameter in the range of from about 200 mm to about 300 mm.

9. The system of claim 1, wherein each of the wafer holder recesses has a diameter in the range of from about 100 mm to about 150 mm.

10. The system of claim 1, wherein each of the wafer holder recesses has a diameter in the range of from about 100mm to about 125 mm.

11. The system of claim 1, wherein the single wafer deposition chamber is sized for processing single substrates having a 200 mm diameter.

12. The system of claim 1, wherein the wafer holder holds 100 mm diameter wafers.

13. The system of claim 1, wherein each of the recesses formed in the wafer holder is circular.

14. The system of claim 1, further comprising a processor for programmably operating the automated substrate transport assembly according to a cycle time program.

15. A method of increasing the throughput of a semiconductor processing system including a reactor comprising a single substrate deposition chamber, said method comprising:
   positioning in said deposition chamber a wafer holder of plate-like form, having a plurality of recesses formed therein, wherein n is the number of recesses, to coplanarly hold a corresponding number n of wafers, with a center-to-center distance between adjacent wafers determined by center-to-center spacing between recesses holding said adjacent wafers;
   providing a substrate cassette coplanarly holding a corresponding number n of wafers therein, wherein wafers coplanarly adjacent to one another have a center-to-center spacing therebetween equal to said center-to-center distance between adjacent wafers in said wafer holder;
   providing an automated substrate transport assembly comprising a corresponding number n of coplanar wands, wherein wands coplanarly adjacent to one another have a center-to-center spacing therebetween equal to said center-to-center distance between adjacent wafers in said wafer holder,
   operating the wafer holder, substrate cassette and automated substrate transport assembly for simultaneous coplanar loading of said n wafers from the substrate cassette into said n recesses in the wafer holder, simultaneous processing of said n wafers in the wafer holder in the single substrate deposition chamber, and simultaneous coplanar transport of said n wafers from the wafer holder.

16. The method of claim 15, further comprising positioning the substrate cassette in a substrate pickup and substrate delivery relationship to the automated substrate transport assembly.

17. The method of claim 16, further comprising
   translating the automated substrate transport assembly into a pickup position relative to the substrate cassette, so that the said corresponding number n of coplanar wands engage and extract said corresponding number n of wafers from the substrate cassette, with each wand engaging and extracting a respective wafer from the substrate cassette;

translating the automated substrate transport assembly to a deposit position relative to the substrate cassette;

releasing from the corresponding number n of coplanar wands the corresponding number n of wafers on the substrate cassette;

depositing thin film material on the corresponding number n of wafers in the deposition chamber, to yield the corresponding number n of coated wafers;

translating the automated substrate transport assembly into a pickup position after the depositing step is completed, and extracting the corresponding number n of coated wafers from the respective recesses in the wafer holder;

translating the automated substrate transport assembly carrying the corresponding number n of coated substrates into a deposit position relative to said substrate cassette or a second substrate cassette; and releasing the corresponding number n of coated substrates to said substrate cassette or a second substrate cassette.

18. The method of claim 15, wherein said coplanar wands in the automated substrate transport mechanism comprise double-sided coplanar wands.

19. The method of claim 15, comprising sequentially using multiple wafer holders including positioning one of the multiple wafer holders in the deposition chamber for processing of wafers thereon, and concurrently regenerating another of said wafer holders after it has been in the deposition chamber.

20. The method of claim 19, wherein said regenerating comprises etch processing of said another of said wafer holders.

21. The method of claim 15, wherein n is 2.

22. The method of claim 15, wherein n is 4.

23. The method of claim 15, wherein the wafer holder has a diameter in the range of from about 200mm to about 350mm.

24. The method of claim 15, wherein the wafer holder has a diameter in the range of from about 200 mm to about 300 mm.

25. The method of claim 15, wherein each of the wafer holder recesses has a diameter in the range of from about 100 mm to about 150 mm.

26. The method of claim 15, wherein each of the wafer holder recesses has a diameter in the range of from about 100 mm to about 125 mm.

27. The method of claim 15, wherein the single wafer deposition chamber is sized for processing single substrates having a 200 mm diameter.

28. The method of claim 15, wherein the wafer holder holds 100 mm diameter wafers.

29. The method of claim 15, wherein each of the recesses formed in the wafer holder is circular.

30. The method of claim 15, further comprising providing a processor for programmably operating the automated substrate transport assembly according to a cycle time program.

* * * * *